United States Patent [19]
Yanagisawa

[11] Patent Number: 5,136,776
[45] Date of Patent: Aug. 11, 1992

[54] ELECTRONIC PART MOUNTING APPARATUS

[75] Inventor: Yoshiyuki Yanagisawa, Kanagawa, Japan

[73] Assignee: Sony Corporation, Tokyo, Japan

[21] Appl. No.: 703,828

[22] Filed: May 21, 1991

[30] Foreign Application Priority Data

May 28, 1990 [JP] Japan .................................. 2-135401

[51] Int. Cl.$^5$ ............................................ H05K 3/30
[52] U.S. Cl. ........................................ 29/740; 29/759
[58] Field of Search ............ 29/740, 741, 759, 834–836

[56] References Cited

U.S. PATENT DOCUMENTS 4,706,379 11/1987 Seno et al. .

OTHER PUBLICATIONS

Patents Abstracts of Japan, vol. 13, No. 421, (E-822) (Hoshino).

*Primary Examiner*—Carl E. Hall
*Attorney, Agent, or Firm*—Lewis H. Eslinger; Jay H. Maioli

[57] ABSTRACT

An electronic part mounting apparatus wherein an original orientation position of a nozzle can be restored accurately at a high speed with a simplified structure includes an index table supported for rotation around a first axis, and a nozzle mechanism carried on the index table and having a nozzle. The nozzle mechanism includes an original orientation returning gear mounted for rotation around a second axis on the index table for returning the nozzle to a predetermined original orientation position. The apparatus further includes an original orientation restoring mechanism including an original orientation restoring gear mounted for rocking motion into meshing engagement with the original orientation returning gear to rotate the original orientation returning gear to position the nozzle at the predetermined original orientation position, and a mechanism for rocking the original orientation restoring gear toward the original orientation returning gear to engage, during such rocking motion, the original orientation restoring gear with the original orientation returning gear when the rotational speed of the original orientation restoring gear reaches a predetermined value.

3 Claims, 6 Drawing Sheets

P1: ATTRACTION
P2: DETECTION OF DISPLACEMENT
P3: ROTATION BY θ
P4: MOUNTING OF PART
P5: ROTATION BY −θ

ELECTRONIC PART MOUNTING APPARATUS

BACKGROUND OF THE INVENTION

1. Field of the Invention

This invention relates to an electronic part mounting apparatus which attracts a very small electronic part or chip thereto and places it at a predetermined location on an electronic circuit board or the like to effect automatic mounting of the electronic part, and more particularly to an original orientation restoring mechanism and an original orientation restoration detecting mechanism in an electronic part mounting apparatus of the type mentioned for returning the angular position of a nozzle provided for attracting a chip thereto to a predetermined original angular position.

2. Description of the Prior Art

Various electronic part mounting apparatus for mounting a chip on an electronic circuit board are conventionally known and disclosed, for example, in Japanese Patent Laid-Open Application No. 62-13100 and Japanese Patent Laid-Open Application No. 1-157600.

Figure 6:
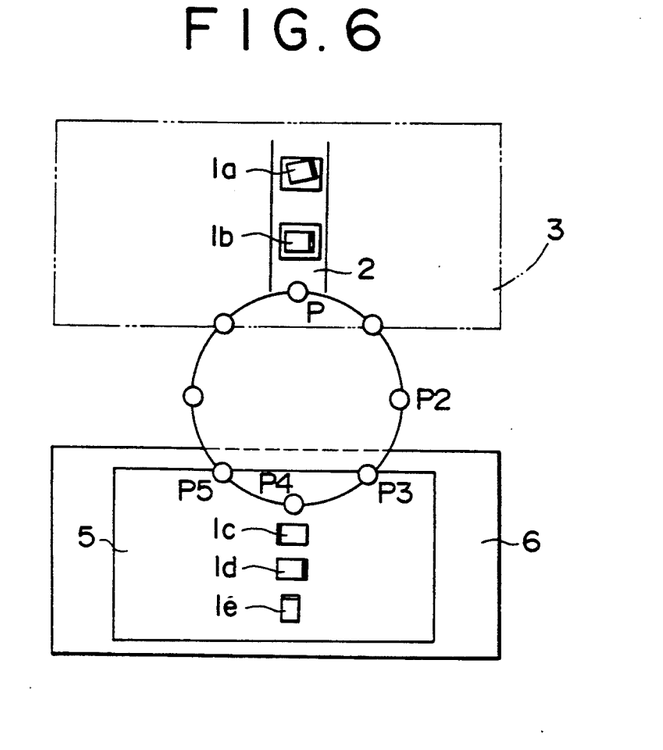
FIG. 6 is a diagrammatic representation illustrating general operation of an electronic part mounting apparatus to which the present invention is applied.

An outline of such conventional electronic part mounting apparatus will be described with reference to FIGS. 6 to 9. A part cassette or electronic part taking out apparatus is provided on a chip supplying station 3 and strips an upper face tape from a mount tape 2 of a double tape to expose a chip enclosed in the double tape on the mount tape 2. Chips 1a and 1b shown in FIG. 6 are in such an exposed condition.

A position P1 on the chip supplying station 3 is a chip attracting position at which a nozzle 7 provided below a rotary head 4 of a part moving mechanism attracts thereto by vacuum the chip 1b exposed above the mount tape 2. The rotary head 4 having the chip 1b attracted thereto is rotated, as an index table 10 is rotated around a support shaft 11, to a displacement detecting position P2 at which displacement of the chip is detected by an optical sensor 17.

The displacement here signifies displacement of such a chip as the chip 1a which is inclined from its regular position when the nozzle 7 attracts the chip 1b thereto by vacuum at the position P1. Since a chip which remains in an inclined position cannot be placed regularly onto a circuit board 5 on a bed 6 which is movable in perpendicular X-Y directions, displacement of a chip is detected by means of the visual sensor 17 in order to correct such displacement at a position P3. A rotary head rotating adjusting mechanism 15 is provided for such correction.

The rotary head 4 places the chip attracted to the nozzle 7 thereof at a position P4. The circuit board 5 is carried on the bed 6, and the bed 6 moves the circuit board 5 to define a position at which the chip is to be dropped from the nozzle 7 of the rotary head 4.

An original orientation restoration of the rotary head 4 is performed at a position P5. In particular, while the chip was rotated by an angle θ at the position P3 to offset the displacement described above, the nozzle 7 is rotated back by an angle equal to the rotational angle θ to restore its original position in order to allow the nozzle 7 to attract a next chip at the position P1. For the original orientation restoration, an original orientation restoring driving mechanism 16 and an original orientation restoring gear 14 are provided. The original orientation restoring gear 14 is held out of engagement with the gear 12 when the index table 10 is rotation, but when an original orientation restoring operation is required, the original orientation restoring gear 14 is rocked toward the rotary head 4 by the original orientation restoring driving mechanism 16 and engaged with the rotary head rotation adjusting gear 13.

Figure 10A:
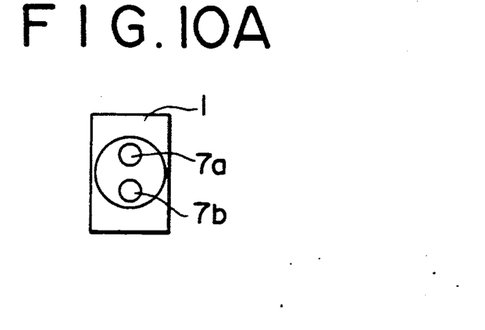
FIGS. 10A and 10B are illustrations showing a relationship between an and of a nozzle and differently oriented electronic parts.
Figure 10B:
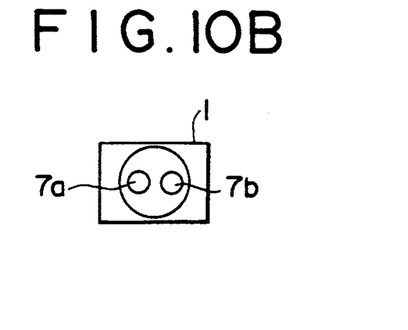

It is to be noted that such original orientation restoring operation is performed, where the nozzle 7 has two nozzle holes 7a and 7b at an end thereof as shown in FIGS. 10A and 10B, selectively for a 90-degree position original orientation restoring operation (FIG. 10A) or for a 0-degree position original orientation restoring operation (FIG. 10B) so that the chip 1 may be attracted in a most suitable condition depending upon orientation of a chip 1 on the tape 2.

Figure 7:
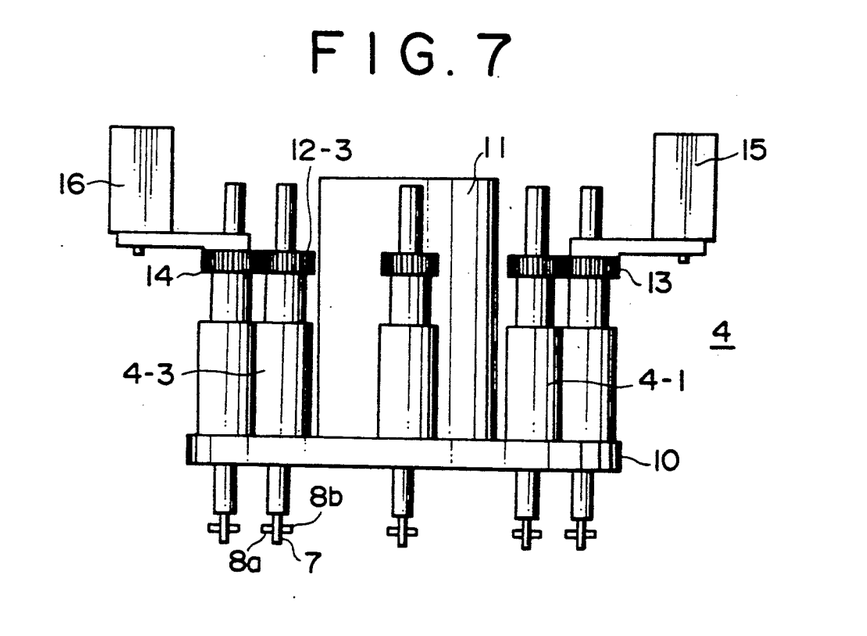
FIG. 7 is a front elevational view of a conventional electronic part mounting apparatus.

Meanwhile, in order to detect such original orientation restoration, a pair of nozzle original orientation select pins 8a and 8b are provided on the nozzle 7 as shown in FIG. 7; and turning motion of the select pin 8a or 8b is detected by an original orientation restoration detecting mechanism (not shown) provided separately from the original orientation restoring driving mechanism 16. The original orientation restoration detecting mechanism is a kind of limit switch and detects that the nozzle 7 has returned to a predetermined origin position when a select pin 8a or 8b is engaged with the limit switch, and when such original orientation restoration is detected, the original orientation restoration detecting mechanism stops operation of the original orientation restoring gear 14.

The conventional original orientation restoring mechanism employs the original orientation restoring gear 14 which is selectively engaged with the gear 12 of the rotary head 4. However, there is a problem that much time is required to smoothly effect meshing engagement between the gear 12 and the original orientation restoring gear 14. From a point of view of an operation speed of the entire electronic part mounting apparatus, a demand for such a high speed operation that an original orientation restoring operation must be completed within 0.1 to 0.2 seconds or so is increased, and a problem is encountered that such conventional meshing engaging method cannot satisfy such high speed original orientation restoring operation.

Further, while the conventional original orientation restoration detecting mechanism is rocked, upon an original orientation restoring operation, toward the nozzle 7, in a manner similar to the original orientation restoring gear 14, since it is driven by a moving mechanism separate from the original orientation restoring driving mechanism 16, such a driving source as a solenoid or an air cylinder is required separately as the moving mechanism. Further, since the original orientation restoration detecting mechanism requires a separate space also for the rocking motion, then the construction of the entire electronic part mounting apparatus becomes great, and further it is difficult to mount the driving source and the original orientation restoration detecting section in a situation wherein miniaturization is required.

SUMMARY OF THE INVENTION

It is an object of the present invention to provide an electronic part mounting apparatus wherein an original orientation position of a nozzle can be restored accurately at a high speed with a simplified structure.

In order to attain the object, according to the present invention, there is provided an electronic part mounting apparatus which comprises an index table supported around a first axis, a nozzle mechanism carried on the index table and having a nozzle, the nozzle mechanism including an original orientation returning gear mounted for rotation around a second axis on the index table for returning the nozzle to a predetermined original orientation position, an original orientation restoring mechanism including an original orientation restoring gear mounted for rocking motion into meshing engagement with the original orientation returning gear to rotate the original orientation returning gear to position the nozzle at the predetermined original orientation position, and means for rocking the original orientation restoring gear toward the original orientation returning gear to engage, during such rocking motion, the original orientation restoring gear with the original orientation returning gear when the rotational speed of the original orientation restoring gear reaches a predetermined value.

A projection for defining an original orientation restoring angular position of the nozzle may be provided on the nozzle while an original orientation restoration detecting mechanism for stopping rotation of the nozzle mechanism when the nozzle mechanism is rotated until the projection is engaged and detecting such engagement is constructed in an integral relationship with the original orientation restoring mechanism such that the original orientation restoring mechanism and the original orientation restoration detecting mechanism are rocked simultaneously. Preferably, the original orientation restoration detecting mechanism has first and second projection stopping means which are selectively operated in response to the direction of turning motion of the projection so as to allow selection of an original orientation restoring angular position of the nozzle.

With the electronic part mounting apparatus, the original orientation restoring gear of the original orientation restoring mechanism and the original orientation returning gear of the nozzle mechanism are engaged with each other when the original orientation restoring mechanism is in a rocked condition and the original orientation restoring gear reaches a predetermined rotational speed before it reaches a maximum speed. Accordingly, the original orientation restoring gear and the original orientation returning gear are engaged smoothly with each other. Further, since such engagement is performed in the course of a continuous rocking operation, there is no wasteful time and meshing engagement is achieved in a short period of time.

Where rotation of the nozzle mechanism is stopped and the original orientation restoration detecting mechanism for detecting such stopping is mounted in an integral relationship on the original orientation restoring mechanism, those mechanisms are rocked integrally in an interlocking relationship, and no other driving source for rocking the original orientation restoration detecting mechanism is required. Besides, the construction is compact and the original orientation restoration detecting accuracy is improved.

Where the original orientation restoration detecting mechanism has the first and second projection arresting means described above, it is possible to select an original orientation restoration angular position of the nozzle.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1A:
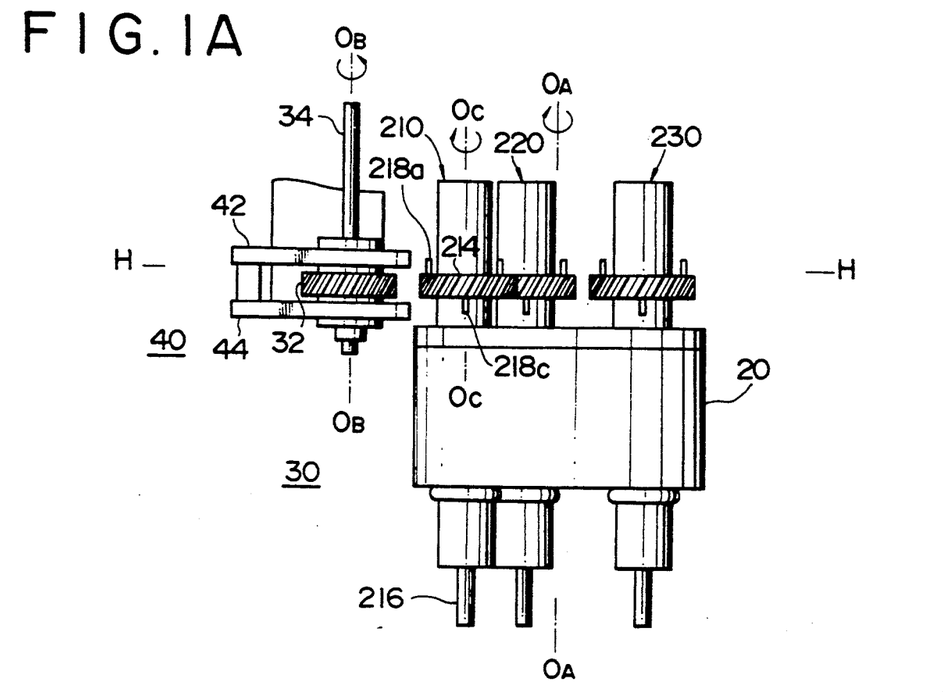
FIGS. 1A and 1B are front elevational views of an original orientation restoring mechanism of an electronic part mounting apparatus at different positions showing an embodiment of the present invention.

Referring first to FIG. 1A, there is shown part of an electronic part mounting apparatus to which the present invention is applied. The electronic part mounting apparatus has a generally similar construction to the conventional electronic part mounting apparatus described hereinabove with reference to FIG. 7 in that, though not shown as such in FIG. 1A, it includes a plurality of rotary heads 4-1 to 4-8 carried on an index table 10, an original orientation restoring gear 14 and an original orientation restoring driving mechanism 16. In particular, each of the rotary heads 4-1 to 4-8 carried for rotation on the index table 10 of FIG. 7 corresponds to a nozzle block 20 in the electronic part mounting apparatus shown in FIG. 1A. Accordingly, though not shown, a plurality of, for example, 8 to 12, such nozzle blocks 20 are carried on such index table 10 as shown in FIG. 7. Thus, in the the nozzle block 20 shown in FIG. 1A, five attracting nozzle mechanisms 210, 220, 230, 240 and 250 are carried for turning motion around an axis $0_A$ of the nozzle block 20 such that nozzles mounted on them may be selectively used. Further, each of the attracting nozzle mechanisms 210 to 250 is mounted for rotation around an axis $0_C$ of a rotary shaft thereof. Where the rotary shaft 11 of the index whell 10 is determined as a main rotary shaft, each of the rotary shafts each having the axis $0_C$ is called a sub rotary shaft. The sub rotary shaft is a rotary shaft for an original orientation restoring operation.

In particular, in the electronic part mounting apparatus of the embodiment of the present invention, the attracting nozzle mechanisms 210 to 250 on each of which such five defferent nozzles are provided such that they can be selectively rotated around the axis $0_A$ of the nozzle block 20 are provided in place of each of the eight nozzles 7 shown in FIG. 7 so that various chips can be attracted by suitably selecting the nozzles.

The attracting nozzle mechanism 210 has an original orientation returning gear 214 and a nozzle 216 above and below the nozzle block 20, respectively. Two nozzle ends 7a and 7b and provided at an end of the nozzle 216 as shown in FIG. 10.

Figure 2A:
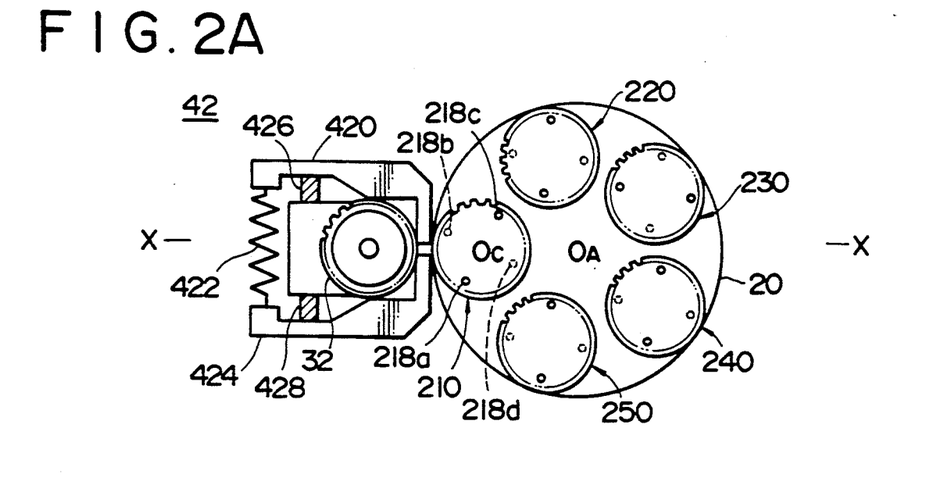
FIGS. 2A and 2B are plan views of the original orientation restoring mechanism of FIGS. 1A and 1B as viewed along lines H—H of FIGS. 1A and 1B.

Referring also to FIG. 2A, a projection 218a and another projection 218c are securely mounted on an upper face of the gear 214 while a further projection 218b and a still further projection 218d are securely mounted on a lower face of the gear 214. Also the other attracting nozzle mechanisms 220 to 250 have a similar structure.

Figure 1B:
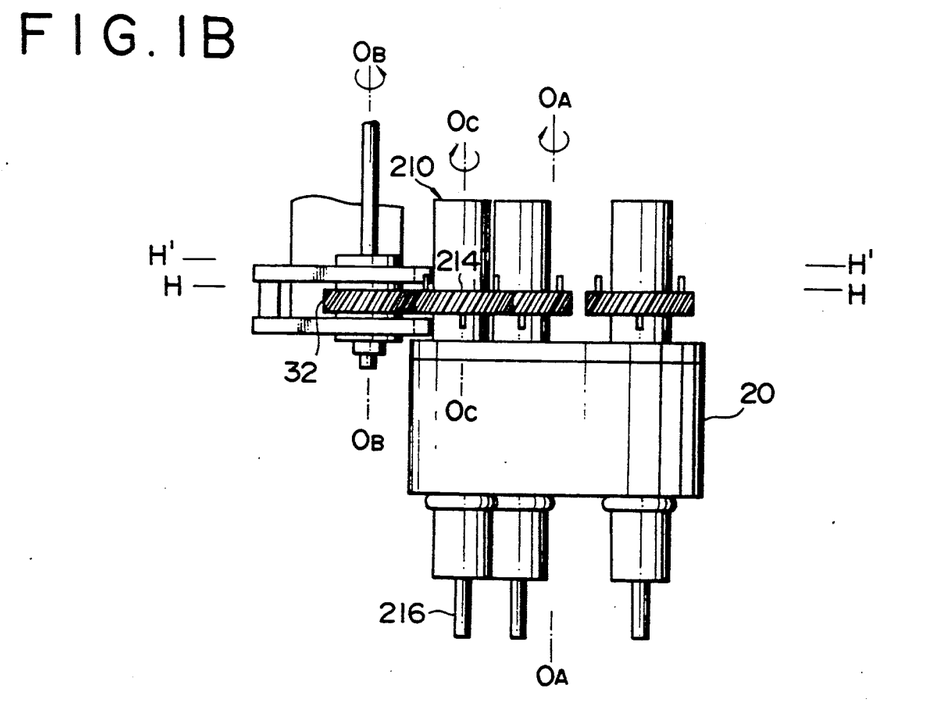

In FIG. 1A, the electronic part mounting apparatus is shown in a condition before an original orientation restoring operation wherein an original orientation restoring gear 32 is not in meshing engagement with the original orientation returning gear 214, but in FIG. 1B, the electronic part mounting apparatus is shown in another condition wherein an original orientation restoring mechanism 30 is in a rocked position at which an original orientation restoring operation is performed by way of the original orientation restoring gear 32.

The original orientation restoring mechanism 30 is rocked in a direction toward the attracting nozzle mechanism 210 by an original orientation restoring mechanism moving mechanism 60 shown in FIG. 3 which will be hereinafter described. The original orientation restoring mechanism 30 includes an original orientation restoring gear driving motor 38 (FIG. 3) for driving the original orientation restoring gear 32 to rotate by way of a rotary shaft 34, and an original orientation restoration detecting mechanism 40 is integrated with the original orientation restoring mechanism 30.

The original orientation restoration detecting mechanism 40 includes an upper original orientation restoration detecting unit 42 and a lower original orientation restoration detecting unit 44 disposed at upper and lower locations on the original orientation restoring gear 32.

Figure 2B:
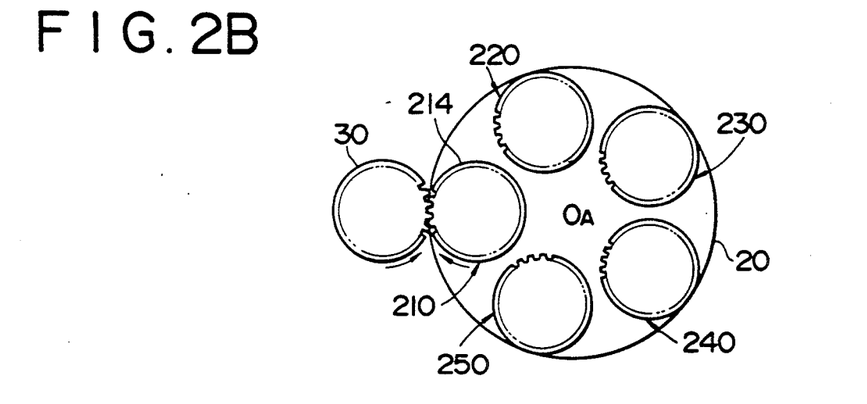
Figure 2C:
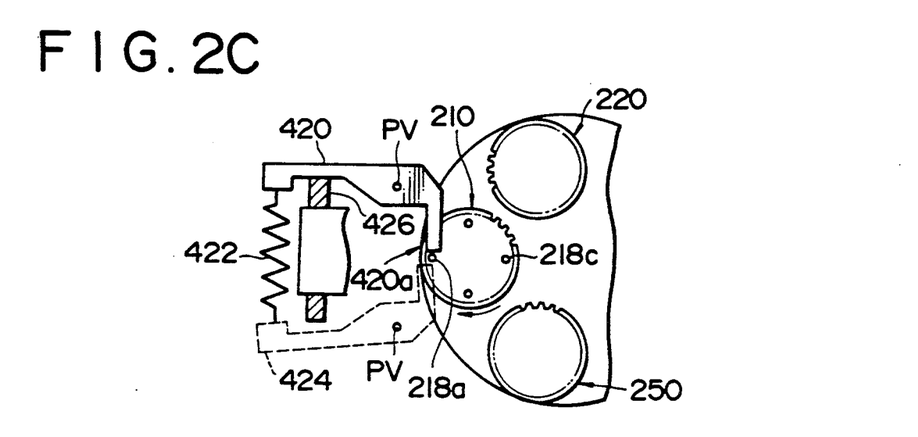
FIG. 2C is a plan view of the original orientation restoring mechanism as viewed along a line H'—H' of FIG. 1B.

In FIG. 2B, the original orientation returning gear 214 of the attracting nozzle mechanism 210 and the original orientation restoring gear 32 are shown in a mutually engaged condition, and in FIG. 2C, the original orientation restoration detecting mechanism 40 is shown in an operating condition.

Figure 3:
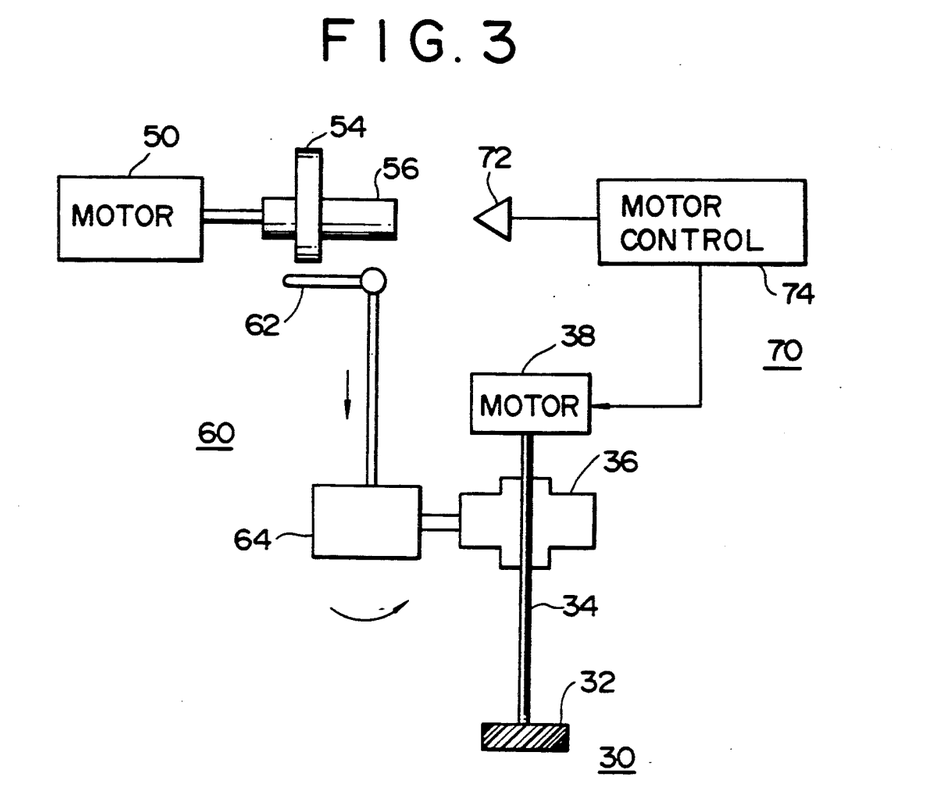
FIG. 3 is a diagrammatic view showing general construction of a rocking mechanism and an original orientation restoring driving motor controlling system of the original orientation restoring mechanism of FIGS. 1A and 1B.
Figure 4:
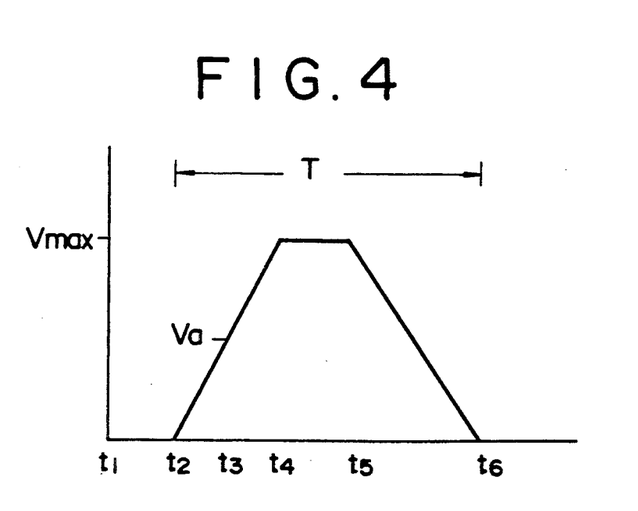
FIG. 4 is a diagram showing an operation characteristic of an original orientation restoring gear driving motor of the original orientation restoring mechanism of FIGS. 1A and 1B.

Referring now to FIG. 3, the original orientation restoring mechanism 30 includes a servomotor 50 for driving the entire electronic part mounting apparatus. A cam 54 is mounted on a shaft 56 of the servomotor 50 such that, by rotation of the cam 54, a lever 62 constituting the original orientation restoring mechanism moving mechanism 60 is pushed down by the cam 54. Upon such downward movement of the original orientation restoring mechanism moving mechanism 60, a supporting portion of the original orientation restoring mechanism 30 is rocked toward the nozzle block 20 by way of a rocking mechanism 64. As a result, the original orientation restoring gear 32 is engaged with the original orientation returning gear 214 of the attracting nozzle mechanism 210. Also an original orientation restoring driving motor controlling system 70 for controlling driving of the original orientation restoring gear driving motor 38 is provided, and a rotation detecting sensor 72 detects a rotational angle of the shaft 56 of the servomotor 50. In response to such rotational angle detection, an original orientation restoring driving motor controlling apparatus 74 controls the original orientation restoring gear driving motor 38. FIG. 4 shows a speed characteristic of the original orientation restoring gear driving motor 38. Meanwhile, FIG. 5 illustrates controlling processing of the original orientation restoring driving motor controlling apparatus 74.

Figure 9:
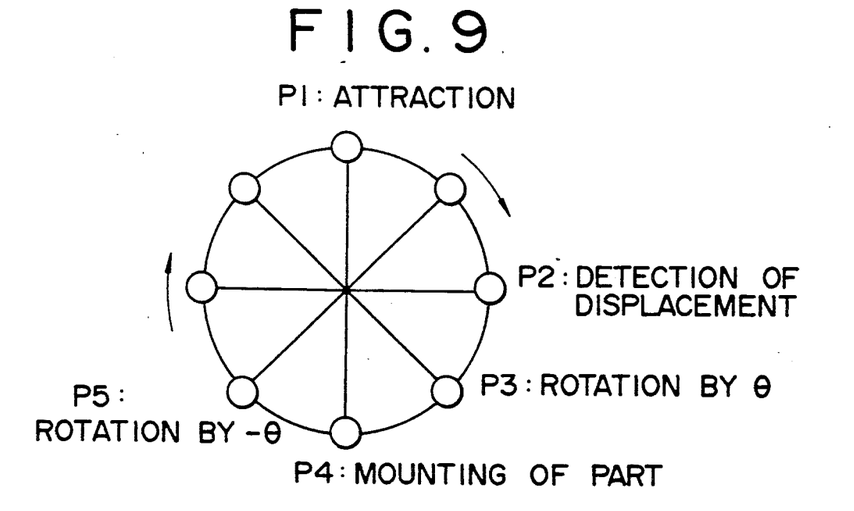
FIG. 9 is a diagrammatic representation showing general operation of the electronic part mounting apparatus.

When the nozzle block 20 is at any position other than the original orientation restoration position P5 of FIG. 9, an original orientation restoring operation of the nozzle mechanism carried on the nozzle block 20 is not performed, and the original orientation restoring gear 32 is held out of engagement with the original orientation returning gear 214 as seen in FIG. 1A and FIG. 2A. This is a condition wherein the cam 54 of FIG. 3 does not yet push down the lever 62.

At a point of time at which an original orientation restoring operation is to be performed after the nozzle block 20 reaches the original orientation restoring position P5, the cam 54 pushes down the lever 62 by rotation of the servomotor 50 to rock the original orientation restoring mechanism 30 toward the nozzle block 20 by way of the rocking mechanism 64. A starting position of such rocking motion is detected by the rotation detecting sensor 72 for detecting a rotational position of the shaft 56, and the original orientation restoring driving motor controlling apparatus 74 starts the original orientation restoring gear driving motor 38 carried on the original orientation restoring mechanism 30 being rocked. Starting control of the original orientation restoring gear driving motor 38 will be described with reference to FIGS. 4 and 5.

Figure 5:
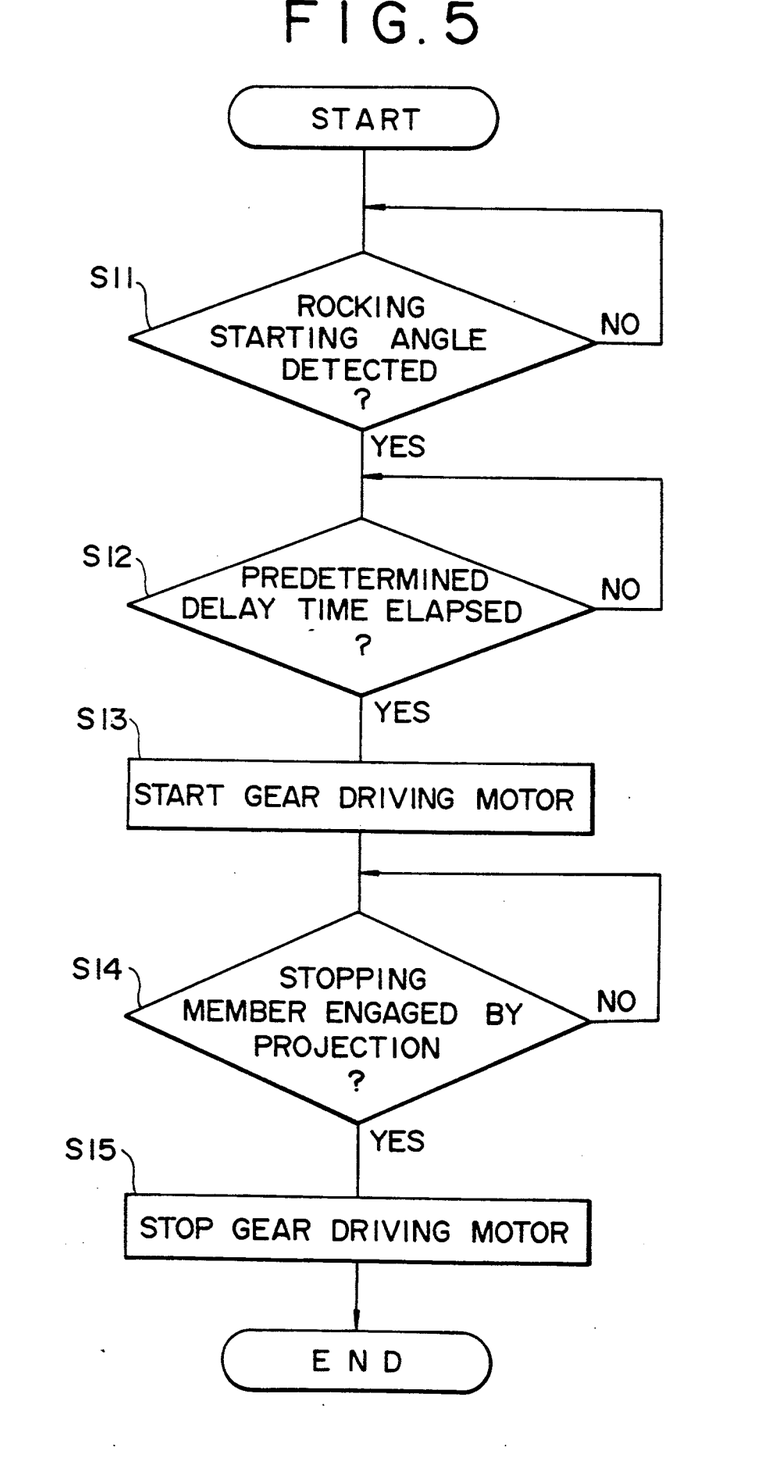
FIG. 5 is a flow chart illustrating operation of the original orientation restoring driving motor controlling system of FIG. 3.

STEP S11 (FIG. 5)

The original orientation restoring driving motor controlling apparatus 74 receives a detection signal from the rotation detecting sensor 72 and detects whether or not the shaft 56 of the servomotor 50 has reached a rocking starting angle. In case the rocking starting angle has not yet been reached, the original orientation restoring driving motor controlling apparatus 74 waits until the rocking starting angle is reached.

STEP S12

If it is detected at a point of time t1 (FIG. 4) that the rocking starting angle has been reached, then the original orientation restoring driving motor controlling apparatus 74 delays for a predetermined period of time $\tau$. The delay time $\tau$ is a time over which starting of the original orientation restoring gear driving motor 38 is to be delayed from the rocking starting point of time t1.

STEP S13

After such delay of the predetermined time $\tau$, the original orientation restoring driving motor controlling apparatus 74 starts the original orientation restoring gear driving motor 38 at a point of time t2. In response to the starting instruction, the orignal orientation restoring gear driving motor 38 which rotates the original orientation restoring gear 32 carried on the original orientation restoring mechanism 30 around an axis $0_B$ (FIG. 1A or 1B) and is being rocked together with the original orientation restoring mechanism 30 is started toward a maximum speed Vmax.

The starting time of the original orientation restoring gear driving motor 38 is designed and adjusted such that, taking a starting characteristic of the original orientation restoring gear driving motor 38 and a rocking characteristic (time) of the original orientation restoring mechanism 30 into consideration, when the speed of rotation of the original orientation restoring gear 32 being rocked reaches a predetermined level, of example, a rotational speed Va about a half or so of the maximum rotational speed (corresponding to Vmax described above), the original orientation restoring gear 32 begins to be engaged with the gear 214. In particular, when the original orientation restoring gear 32 which is being rocked into meshing engagement with the original orientation returning gear 214 of the attracting nozzle mechanism 210 comes near to a substantial end of its rocking motion so that a speed is reached at which the original orientation restoring gear 32 can be engaged smoothly with the original orientation returning gear 214 to be rotated (time t3), the original orientation restoring gear 32 and the original orientation returning gear 214 are engaged with each other. Consequently, in the course of a rocking operation, the original orientation restoring gear 32 and the original orientation returning gear 214 are engaged smoothly with each other at a comparative low speed at which they are engaged easily with each other. Accordingly, there is no waste in engaging time.

A condition wherein the original orientation restoring gear 32 and the original orientation returning gear 214 engage with each other is shown in FIG. 1B, 2B and 2C.

At a time t4, the original orientation restoring gear driving motor 38 reaches its maximum speed Vmax and also the original orientation restoring gear 32 reaches its maximum rotational speed. Then, the original orientation returning gear 214 is rotated to a predetermined original orientation angular position.

The original orientation restoring angular position is defined by a position of any one of the projections 218a to 218d mounted in an equally spaced relationship by an angle of 90 degrees on the opposite faces of the original orientation returning gear 214.

When the original orientation restoring gear 32 and the original orientation returning gear 214 are engaged with each other while being rotated in the directions indicated by arrow marks in FIG. 2B, also the projection 218a on the original orientation returning gear 214 is turned around the axis 0c. The projection 218a is turned along an outer edge of a second arm 424 of the upper original orientation restoring detecting unit 42 of the original orientation restoration detecting mechanism 40 to pivot the second arm 424 around a pivot shaft PV as indicated by broken lines in FIG. 2C until it is engaged with an abutting portion 420a of a first arm 420 of the upper original orientation restoring detecting unit 42 opposing to the second arm 424. Consequently, rotation of the original orientation returning gear 214 and also rotation of the nozzle mechanism 210 is stopped.

It is to be noted that the first arm 420 and the second arm 424 are each supported for pivotal motion around the pivot shatf PV. The first and second arms 420 are connected to each other by an escapement spring 422 such that each of them is pivoted as indicated by broken lines of the second arm 424 by a projection of the nozzle mechanism 210 which is turned in a direction along the outer edge thereof while the opposing first arm 420 is restrained from pivotal motion by a stopping member 426 to stop the turning motion of the projection. The stopping member 426 also serves as a pressure detecting sensor having a pressure detecting function to detect that a projection, for example, the projection 218a, is contacted with the abutting portion 420a. Steps S14 and S15.

When the original orientation restoring driving motor controlling apparatus 74 receives from the stopping member 426 a signal indicating that it is detected that the projection 218a has been engaged with the abutting portion 420a of the first arm 420, the original orientation restoring driving motor controlling apparatus 74 outputs a stopping instruction to the original orientation restoring gear driving motor 38 at a point of time t5. Consequently, rotation of the original orientation restoring gear driving motor 38 is stopped and also rotation of the original orientation restoring gear 32 is stopped.

It is to be noted that, in response to such rotation stopping operation, also rotation of the servomotor 50 rocks, by way of the cam 54 and the original orientation restoring detecting mechanism moving mechanism 60, the original orientation restoring mechanism 30 in a direction in which the original orientation restoring gear 32 is disengaged from the original orientation returning gear 214. Consequently, the position of the nozzle 216 of the attracting nozzle mechanism 210 which has been returned to the original orientation at the turning angular position of the projection 218a, at 0 degree in the present embodiment, is maintained.

The operation time T (between the points of time t2 and t6) of the original orientation restoring gear driving motor 38 shown in FIG. 4 is less than 0.1 second and short. Then, the point of time t3 is a time delayed by 10 to 20 ms from the point of time t2.

For the original orientation restoration of the angle of 0 degree or 180 degrees, the projection 218a or 218c on the upper face of the gear 214 and the first arm 420 are used, and for the original orientation restoration of the angle of 90 degrees or 270 degrees, the projection 218b or projection 218d and the second arm 424 are used.

Since the original orientation restoration detecting mechanism 40 has an integral structure with the original orientation restoring mechanism 30 and rocking operation of them is performed by the common servomotor 50, the structure is simplified, and also the original orientation restoration detecting accuracy is high due to their integral structure.

Figure 8:
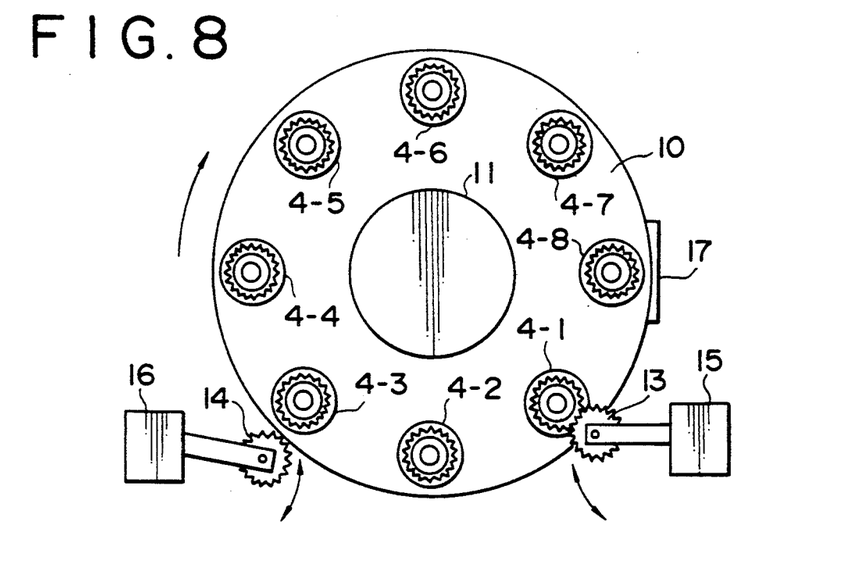
FIG. 8 is a plan view of the electronic part mounting apparatus of FIG. 7.

While the embodiment described above is exemplified for the case wherein a plurality of nozzle mechanisms are carried on the nozzle block 20, the present invention can naturally be applied, similar to the manner as described above, to the case wherein a single nozzle mechanism is carried on the nozzle block 20 as illustrated in FIGS. 7 and 8. Meanwhile, the original orientation restoring operation is not limited to that at the position P5 of FIG. 9 and may be performed at any position provided it is forward of the chip attracting position P1.

Having now fully described the invention, it will be apparent to one of ordinary skill in the art that many changes and modifications can be made thereto without departing from the spirit and scope of the invention as set forth herein.

What is claimed is:

1. An electronic part mounting apparatus, comprising:
   an index table supported for rotation around a first axis;
   a nozzle mechanism carried on said index table and having a nozzle, said nozzle mechanism including an original orientation returning gear mounted for rotation around a second axis on said index table for returning said nozzle to a predetermined original orientation position;
   an original orientation restoring mechanism including an original orientation restoring gear mounted for rocking motion into meshing engagement with said original orientation returning gear to rotate said original orientation returning gear to position said nozzle at the predetermined original orientation position; and
   means for rocking said original orientation restoring gear toward said original orientation returning gear and for engaging said original orientation restoring gear with said original orientation returning gear when the rotational speed of said original orientation restoring gear reaches a predetermined value.

2. An electronic part mounting apparatus according to claim 1, wherein said nozzle mechanism further includes a projection arranged on said nozzle for defining the predetermined original orientation position of said nozzle and said original orientation restoring mechanism includes an original orientation restoration detecting mechanism for stopping rotation of said nozzle mechanism when said nozzle mechanism is rotated until said projection is engaged therewith and for detecting such engagement, said detecting mechanism being constructed integrally with said original orientation restoring mechanism such that said original orientation restoring mechanism and said original orientation restoration detecting mechanism are rocked simultaneously by said means for rocking.

3. An electronic part mounting apparatus according to claim 2, wherein said original orientation restoration detecting mechanism has first and second projection stopping means selectively operated in response to a direction of turning motion of said projection, whereby an original orientation restoring angular position of said nozzle is selected by said first or second projection stopping means.

* * * * *